(12) United States Patent
Chen (10) Patent No.: US 6,384,442 B1
(45) Date of Patent: May 7, 2002

(54) FABRICATION PROCESS FOR METAL-INSULATOR-METAL CAPACITOR WITH LOW GATE RESISTANCE

(75) Inventor: Sheng-Hsiung Chen, Taiwan (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/946,983

(22) Filed: Sep. 6, 2001

Related U.S. Application Data

(62) Division of application No. 09/640,545, filed on Aug. 17, 2000, now Pat. No. 6,313,003.

(51) Int. Cl.$^7$ .............................................. H01L 27/108
(52) U.S. Cl. ........................ 257/298; 257/278; 257/295; 257/283; 257/307
(58) Field of Search ................................. 257/295, 296, 257/278, 298, 306, 310, 283; 438/241, 210, 313, 396, 399, 253, 256, 250, 239

(56) References Cited

U.S. PATENT DOCUMENTS

| | | | |
|---|---|---|---|
| 5,162,258 A | 11/1992 | Lemnios et al. | 437/184 |
| 5,812,364 A | 9/1998 | Oku et al. | 361/312 |
| 5,913,126 A | 6/1999 | Oh et al. | 438/393 |
| 5,918,135 A | 6/1999 | Lee et al. | 438/393 |
| 5,920,775 A * | 7/1999 | Koh | 438/241 |

* cited by examiner

Primary Examiner—Charles Bowers
Assistant Examiner—Yennhu B. Huynh
(74) Attorney, Agent, or Firm—George O. Saile; Stephen B. Ackerman (57) ABSTRACT

A new method is provided for the creation of openings in a layer of dielectric while at the same time forming a dielectric that forms the dielectric of MIM capacitors. Under the first embodiment of the invention a layer of insulation, such as $Si_xN_y$ or SiON or TaN and TiN, is deposited over the surface of a semiconductor substrate, points of electrical contact have been provided in this semiconductor surface. A layer of IMD is deposited over the layer of insulation, an opening is created in the layer of IMD that aligns with and overlays a contact point over which a MIM capacitor is to be created. Under the second embodiment of the invention, a stack of three layers of a first layer of TaN followed by $SiO_x$ or $Si_xN_y$ followed by a second layer of TaN is used as the dielectric layer for the capacitor whereby the first layer of TaN is used as an etch stop for an opening that is etched for the creation of the upper plate of the capacitor.

20 Claims, 7 Drawing Sheets

100
FABRICATION PROCESS FOR METAL-INSULATOR-METAL CAPACITOR WITH LOW GATE RESISTANCE

This is a division of patent application Ser. No. 09/640,545, filing date Aug. 17, 2000 now U.S. Pat. No. 6,313,003, Fabrication Process For Metal-Insulator-Metal Capacitor With Low Gate Resistance, assigned to the same assignee as the present invention.

BACKGROUND OF THE INVENTION (1) Field of the Invention

The invention relates to the fabrication of integrated circuit devices, and more particularly, to a method of creating a capacitor for mixed-mode applications that has low gate resistance.

(2) Description of the Prior Art

The manufacturing of semiconductor devices applies a number of different but interacting disciplines that collectively create high performance semiconductor devices. The majority of these semiconductor devices have as function the processing of digital information which is characterized by zero and one conditions, typically created by on-off conditions of switching transistors. In addition, hybrid functions can be provided that address not only the processing of digital signals but also address the processing of analog signals, either as a function that is provided by one analog semiconductor device or in collaboration with digital devices. Device performance improvements have been sought and established by continuously decreasing device dimensions thereby concurrently increasing device packaging density. This poses problems for a number of the typical analog components such as capacitors and inductors that have physical dimensions that do not lend themselves to ready integration into a highly miniaturized, sub-micron device environment.

The mixing of functions and processing capabilities results in a mixing of components that coexist within one semiconductor device. It is therefore not uncommon to see resistors and capacitors that form part of a semiconductor device which does not negate the fact that the vast majority of device components is made up of transistors, gate electrodes and a variety of switching components that address logic processing functions. Capacitors can for instance form a basic component of analog circuits that are used for analog applications such as switched capacitor filters. Capacitors are also widely applied in digital applications such as the storage node for Dynamic Random Access Memory (DRAM) circuits. This ability of capacitors to function in either the digital or the analog mode is referred to as the mixed mode application of the capacitor. Mixed mode applications as part of logic processing is expected to find increased application with an emphasis on high frequency applications. Continued reduction in device dimensions has further placed greater emphasis on using copper as an interconnect material, the limitation that this approach experiences however is that the technology of creating capacitive components in a copper interconnect environment is as yet in its infancy, especially where this interconnect environment makes use of the copper damascene process. One process has recently been explored that uses TaN as the material of choice for the creation of the capacitor, this approach however includes the application of an oxide etch stop on the applied TaN material resulting in problems of planarization and etching control and accuracy.

The DRAM technology is widely used for data storage where one transistor and one capacitor form one DRAM cell. For the capacitor a stacked capacitor is frequently used since this structure has good data storage performance characteristics combined with low surface space requirements. To fabricate a DRAM device, a modified CMOS process is typically used. One other application in which the CMOS structure has been successfully applied is in the creation of image sensors.

With the conventional damascene process, a metal via plug is first formed in a surface, typically the surface of a semi-conductor substrate. A layer of dielectric (for instance $SiO_2$) is deposited over the surface (using for instance PECVD technology); trenches (for metal lines) are formed in the dielectric (using for instance RIE technology). Metal is deposited to fill the trenches; the excess metal on the surface is removed. A planar structure of interconnect lines with metal inlays in the (intra-level) dielectric is achieved in this manner.

An extension of the damascene process is the dual damascene process whereby an insulating or dielectric material, such as silicon oxide, is patterned with several thousand openings for the conductive lines and vias, which are filled at the same time with metal. Damascene is an interconnection fabrication process in which grooves are formed in an insulating layer and filled with metal to form the conductive lines. Dual damascene is a multi-level interconnection process in which, in-addition to forming the grooves of single damascene, conductive via openings are also formed. One of the dual damascene approaches uses a dielectric layer that is formed by three consecutive depositions whereby the central layer functions as an etch stop layer. This etch stop layer can be SiN, the top and bottom layer of this three layer configuration can be $SiO_2$. This triple layer dielectric allows first forming the vias by resist patterning the vias and etching through the three layers of dielectric. The conductive pattern can then be formed in the top layer of dielectric whereby the central layer of SiN forms the stop layer for the etch of the conducting pattern. Another approach, still using the three-layer dielectric formed on the substrate surface, is to first form the pattern for the conducting lines in the top layer of the dielectric whereby the SiN layer again serves as etch stop. The vias can then be formed by aligning the via pattern with the pattern of the conducting lines and patterning and etching the vias through the etch stop layer of SiN and the first layer of dielectric. Yet another approach is to deposit the three layer dielectric in two steps, first depositing the first layer of $SiO_2$ and the etch stop layer of SiN. At this point the via pattern can be exposed and etched. The top layer of $SiO_2$ dielectric is then deposited; the conducting lines are now patterned and etched. The SiN layer will stop the etching except where the via openings have already been etched.

Low resistivity metals such as aluminum and copper and their binary and ternary alloys have been widely explored as fine line interconnects in semiconductor manufacturing. Typical examples of fine line interconnect metals include $Al_xCu_y$, ternary alloys and other similar low resistivity metal-based alloys. Emphasis on scaling down line width dimensions in very large scale integrated (VLSI) circuitry manufacturing has led to reliability problems including inadequate isolation, electromigration, and planarization. Damascene processes using metal fill vias and lines followed by chemical mechanical polishing (CMP) with various Al, Cu and Cu-based alloys are a key element of future wiring technologies for very large-scale system integration (VLSI). A key problem is filling high aspect ratio vias and lines without voids or seams, and creating homogeneous structures.

As already stated, copper is at this time explored as an alternate metal to be used as an interconnect metal. Copper has so far not found wide application as an interconnect metal, this despite its relatively low cost, low resistivity, high electromigration resistance and stress voiding resistance. Copper also suffers from high diffusivity in common insulating materials such as silicon oxide and oxygen-containing polymers. For instance, copper tends to diffuse into polyimide during high temperature processing of the polyimide. This causes severe corrosion of the copper and the polyimide due to the copper combining with oxygen in the polyimide. This corrosion may result in loss of adhesion, delamination, voids, and ultimately a catastrophic failure of the component. Copper interconnects are therefore typically encapsulated by at least one diffusion barrier to prevent diffusion into the silicon dioxide layer. Silicon nitride is frequently use as a diffusion barrier to copper, but the prior art teaches that the interconnects should not lie on a silicon nitride layer because it has a high dielectric constant compared with silicon dioxide. The high dielectric constant causes an undesired increase in capacitance between the interconnect and the substrate. A typical barrier layer is deposited using rf. sputtering of titanium nitride, tantalum, tungsten, niobium, molybdenum, Ti/TiN or Ti/W and is more preferably formed from TiN. The barrier layer can also be used to improve the adhesion of the subsequent overlying tungsten layer. A barrier layer is preferably about 100 and 500 angstrom thick and more preferably about 300 angstrom thick.

Recent technology has found increased emphasis on mobile communication applications that center around compact high-frequency equipment. With the continued improvements in the performance characteristics of this equipment, continued emphasis will be placed on small size of the equipment, low power consumption, increased frequency applications and low noise levels. Semiconductor devices are used in the field of mobile communication for the creation of Radio Frequency (RF) amplifiers. A major component of a typical RF amplifier is a tuned circuit that contains inductive and capacitive components. The key challenge in the creation of the inductive and capacitive components is to minimize the surface area that is required for these components while maintaining a high Q value for the inductor and high storage capability for the capacitive component. Conventional inductors that are created on the surface of a substrate are of a spiral shape, whereby the spiral is created in a plane that is parallel with the plane of the surface of the substrate. Conventional methods that are used to create the inductor on the surface of a substrate suffer several limitations such as poor integration of the process that is used to create the inductor into a typical process of Integrated Circuit manufacturing. The common objectives that must be pursued in the creation of an inductor are to increase the quality value of the inductor, to increase the frequency of the LC self-resonance of the circuit thereby increasing the frequency range over which the inductor can be used, and to reduce the surface area that is required for the creation of the inductor.

The process of the invention addresses the above indicated objectives and problems by solving the typically experienced problems of planarity and etch stop on TaN, by solving topography problems that are typically experienced in creating stacked capacitors, and by solving problems of planarity and lack of uniformity of created trench thickness.

A typical processing sequence that is used for the formation of a metal-insulator-metal thin film capacitor is shown in FIG. 1. The MIM capacitor can be part of a multi-wiring structure whereby a multiplicity of elemental circuit elements such as diodes, field effect transistor, capacitors, resistors and inductors a located on the surface of a substrate forming footprints on this surface. Selective interconnection of these circuit elements by means of an patterned overlying layer of metal yields a device structure of a personalized nature that is dedicated to specific signal processing applications.

Figure 1A:
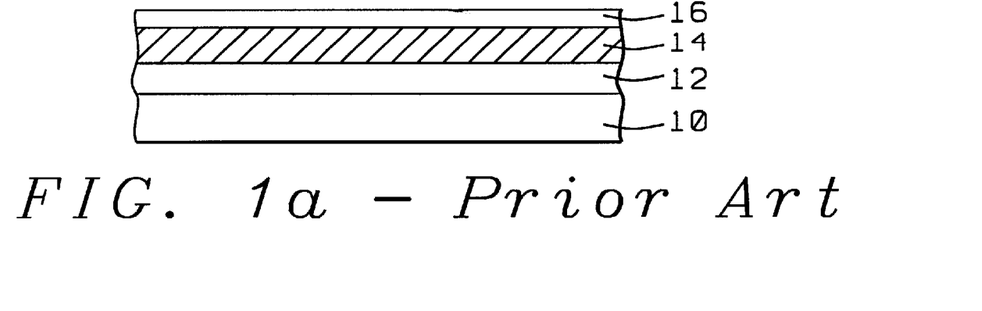
FIG. 1a shows a cross section of a semiconductor substrate over which a layer of insulation, a layer of metal and a conductive layer have been deposited.
Figure 1B:
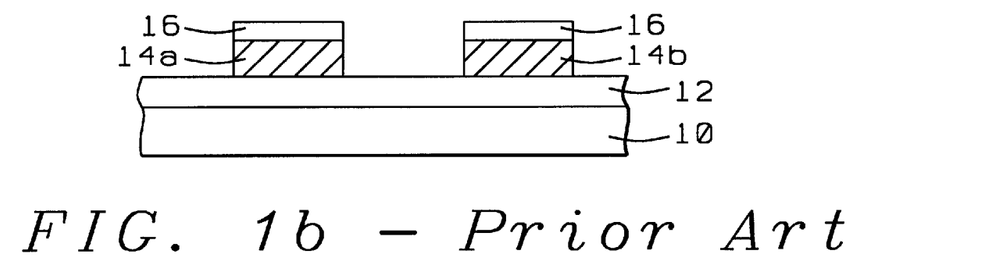
FIG. 1b shows a cross section of the substrate of FIG. 1a after the layers of metal and the conductive layer have been patterned and etched forming the lower plate of a MIM capacitor and a point of electrical contact on the surface of the substrate.

The Prior Art process of forming a MIM capacitor starts by depositing a first layer of insulation, layer 12, over the surface of a silicon substrate 10. The purpose of the layer of insulation is to insulate overlying devices and components from the underlying surface of the silicon substrate while at the same time providing for a means of connecting overlying devices of components to points of electrical contact in the surface of the substrate by selectively creating openings in the layer of insulation. A layer 14 of metal, typically aluminum, is deposited over the layer 12 of insulation, this layer of metal forms the lower plate of the to be created capacitor or can perform the function of an interconnect line (first level of interconnect wiring). For reasons of creating a smooth upper level surface of the lower capacitor plate, a conductive layer 16, typically of titanium nitride, is deposited over the surface of the layer 14 of metal. Layers 14 and 16 are patterned and etched using conventional methods of photolithographic exposure followed by an etch, creating in this manner the two platforms that are shown in FIG. 1*b* wherein one of the platforms, for instance layers 14*a*/16, is used for interconnect wiring or to form the first layer of a vertical inductor that can be created on the surface of substrate 10 while the second platform, for instance platform 14*b*/16, is further used for the creation of the MIM capacitor.

Figure 1C:
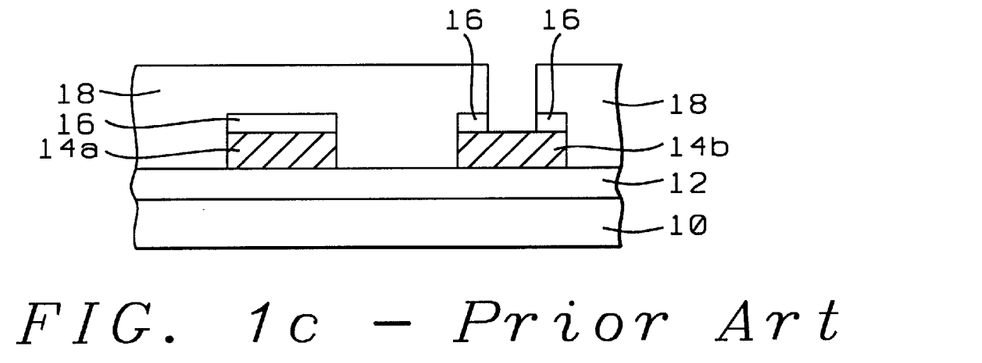
FIG. 1c show a cross section after an insulating layer has been deposited over the structure of FIG. 2 and further patterned and etched to create an opening to the point of electrical contact on the surface of the substrate.
Figure 1D:
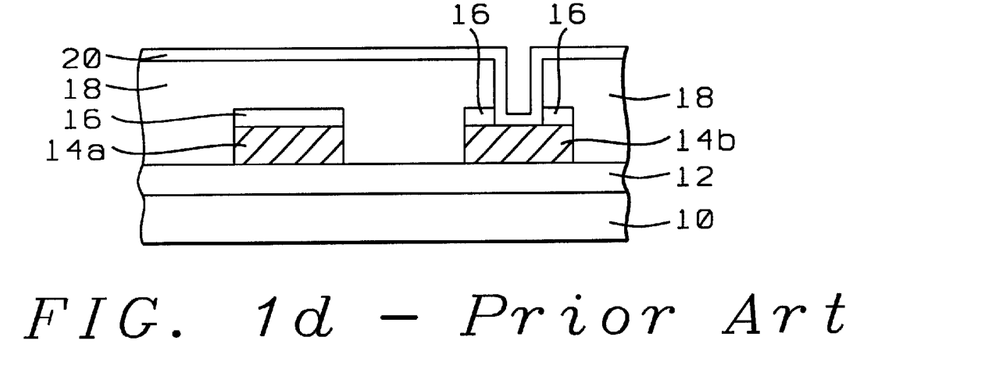
FIG. 1d show a cross section after an insulating layer has been deposited over the structure of FIG. 1.

FIG. 1*c* shows the deposition and patterning of a second layer 18 of insulation whereby the patterning of layer 18 has removed that portion of the second insulation layer 18 and the insulation layer 16 that overlies the surface of the lower capacitor plate 14*b*.

A dielectric layer must next be provided for the MIM capacitor, a layer 20 of silicon oxide or any other dielectric is therefore blanket deposited over the structure of FIG. 1*c*, this layer must remain in place above the lower capacitor plate but must be removed above the contact point 14*a* in order to be able to establish contact with this point. Opening 17, FIG. 1*e*, is therefore created by patterning and selectively etching layers 20 and 18, contact opening 17 is aligned with and centered with respect to the underlying interconnect point 14*a*.

Figure 1E:
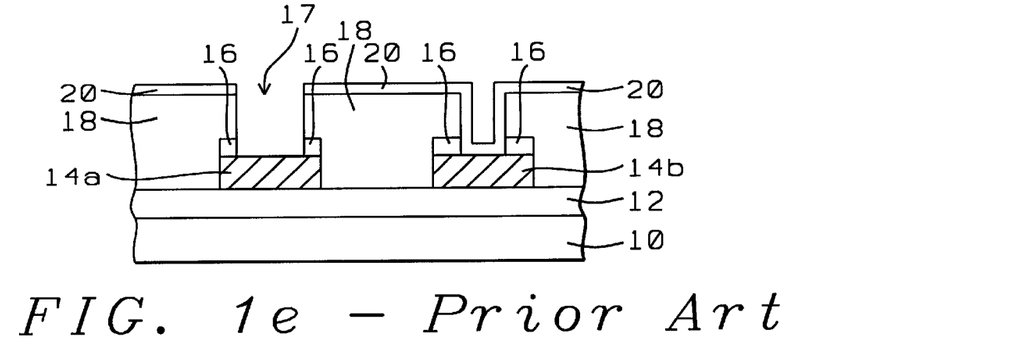
FIG. 1e shows a cross section of the substrate after the insulating layer has been etched thereby creating an opening to contact the electrical point of contact on the surface of the substrate.
Figure 1F:
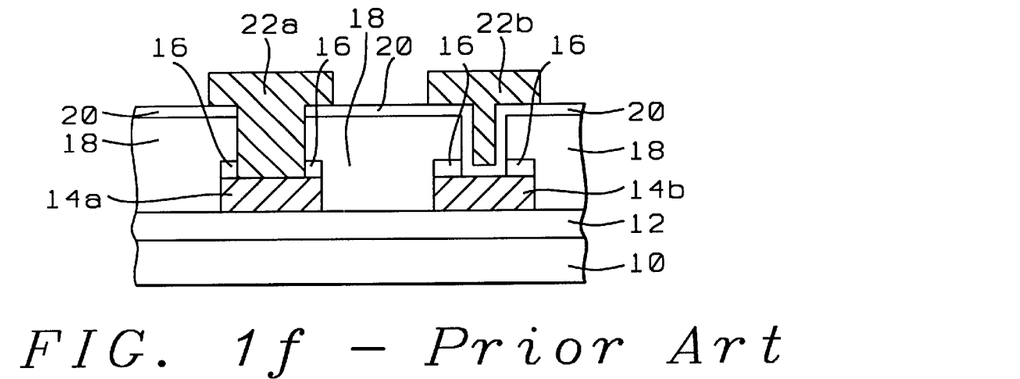
FIG. 1f shows a cross section after a layer of metal has been deposited, patterned and etched thereby creating a second plate of the MIM capacitor in addition to creating a point of electrical contact on the surface of the substrate.

A conductive layer, typically aluminum, is next blanket deposited over the structure of FIG. 1*e* and patterned and etched thereby creating the contact plug 22*a* to the underlying point of electrical contact 14*a* further forming the upper capacitor plate 22*b*, see FIG. 1*f*.

Figure 2:
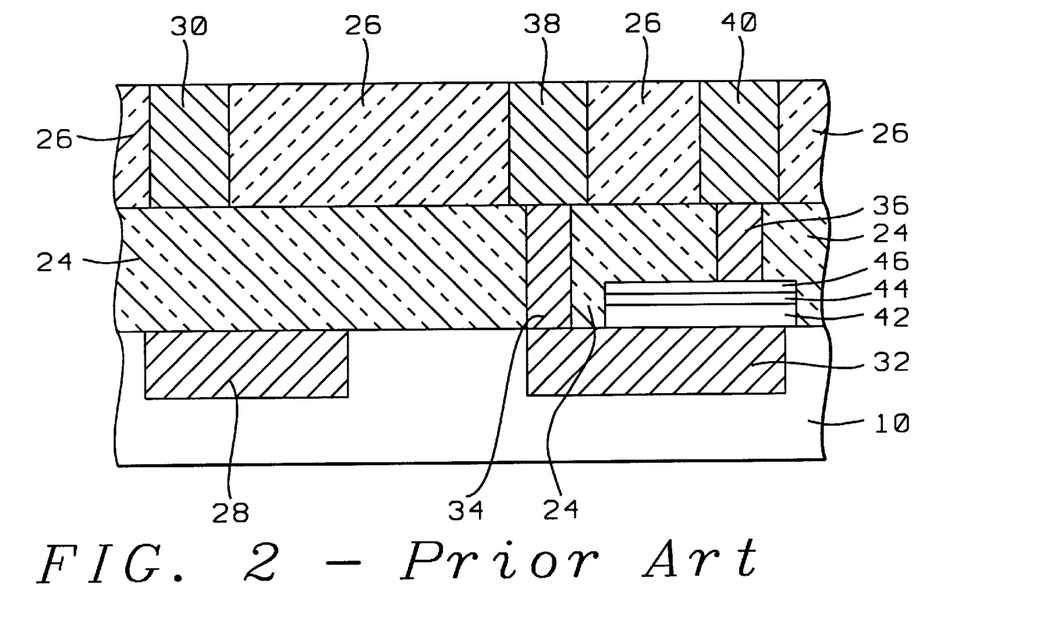
FIG. 2 shows a cross section of a Prior Art MIM capacitor in addition to a point of electrical contact whereby the dielectric that is used for the MIM capacitor contains a stack of three layers.

The Prior Art method that has been detailed above for the formation of a MIM capacitor with the simultaneous formation of an electrical contact point has highlighted aluminum as a typical metal that can be used for the formation of the capacitor plates. Future technologies are however, for reasons that have been highlighted above, aimed at using copper as a material for the formation of the capacitor plates. The process of the invention addresses the formation of MIM capacitors whereby copper is used as the metal of choice for the capacitor plates and the thereby simultaneously created interconnect points (interconnect points that can also be used to further form layers of an inductor that is created vertically on the surface of a substrate). The Prior Art process that has been highlighted above under FIGS. 1*a* through 1*f* also has applied only one layer (layer 20, FIG. 1*d* and following) of dielectric in creating the dielectric for the MIM capacitor while the upper capacitor plate has for the example shown been aligned with the lower plate. These restrictions need not apply for other, more sophisticated capacitor designs as is shown in FIG. 2. FIG. 2 makes use of the basic premise that a capacitor contains two conducting media that are separated by a dielectric. The MIM capacitor that is shown contains the following elements:

- 10 the substrate on the surface of which the MIM capacitor is created
- 24 a first layer of dielectric
- 26 a second layer of dielectric
- 28 a (copper) point of electrical contact that is provided in the surface of substrate 10
- 30 a (copper) plug that is aligned with copper plug 30 and that can serve as a partial construct of a (vertical) inductor that is created on the surface of the substrate 10
- 32 a (copper) point of contact that is provide in the surface of substrate 10 over which a MIM capacitor is to be created
- 34 and 36 are two (copper) plugs that are provided in dielectric layer 24 and that align with point of contact 32 in the surface of substrate 10
- 38 and 40 are two (copper) plugs that are provided in dielectric layer 26 and that align with copper plugs 34 and 36 respectively
- the layer 42/44/46 forms the dielectric of the MIM capacitor whereby the lower plate of the capacitor is formed by the copper plug combination 32/34/38 while the upper plate of the capacitor is formed by the copper plug combination 36/40. The stacked layer 42/44/46 is selected as such for reasons of creating the optimum dielectric (constant) material for the MIM capacitor, the materials used for this stacked dielectric are follows: layer 42 contains TaN, layer 44 contains $SiO_x$ or $S_xN_y$ while layer 46 contains TaN. In creating the opening for plug 36, it is clear that layer 46 of TaN is used as the etch stop. A layer 46 of TaN, especially where the thickness of the layer is kept as thin as possible (to gain maximum capacitive value of the MIM capacitor), provides an unreliable etch stop potentially resulting in overetch and damage to the dielectric of the capacitor. In addition, the relative complexity of the three layers 42/44/46 makes it difficult to maintain good planarity on the surface of the stack of layers. Good planarity is required for reasons of reliability (too thin or a punctured dielectric makes the MIM capacitor prone to shorting between the two plates of the capacitor) and design (the dielectric of a capacitor must be uniformly distributed between the plates of the capacitor in order to provide dependable capacitive values). The process of the invention addresses these problems and provides a method whereby these problems are avoided.

U.S. Pat. No. 5,162,258 (Lemnios et al.) shows a process for a MIM capacitor. However, this reference differs from the invention.

U.S. Pat. No. 5,918,135 (Lee et al.) forms a MIM capacitor that does not use a standard barrier layer, see FIG. 7 and col. 4. Lee forms a capacitor dielectric layer over/through only 1 IMD layer.

U.S. Pat. No. 5,812,364 (Oku et al.), U.S. Pat. No. 5,920,775 (Koh) and U.S. Pat. No. 5,913,126 (Oh et al.) show other MIM processes.

SUMMARY OF THE INVENTION

A principle objective of the process of the invention is to provide a method of etching openings for the creation of a capacitor, whereby this method does not use an underlying layer of dielectric as an etch stop layer.

Another objective of the invention is to provide a dependable method for creating a dielectric that can be applied in the creation of a MIM capacitor.

Another objective of the invention is to provide a method of creating a MIM capacitor, whereby methods of damascene can be applied.

Yet another objective of the invention is to provide a method of creating a MIM capacitor, whereby this method can at the same time create other conventional device components, most notably vertical inductors, while the processes of the invention makes use of known damascene processes and technology.

A still further objective of the invention is to avoid problems of surface planarity during the creation of dielectrics that are used as dielectric for MIM capacitors.

In accordance with the objectives of the invention a new method is provided for the creation openings in a layer of dielectric while at the same time forming a dielectric that forms the dielectric of MIM capacitors.

Under the first embodiment of the invention a layer of insulation, such as SiON or $Si_xN_y$, is deposited over the surface of a semiconductor substrate, points of electrical contact have been provided in this semiconductor surface. These points of electrical contact contain at least one point of electrical contact over which a MIM capacitor needs to be formed. In addition, these points of electrical contact may contain points of contact over which other electrical components need to be formed such as a vertically positioned (with respect to the surface of the underlying semiconductor substrate) inductor. A layer of IMD is deposited over the layer of insulation, an opening is created in the layer of IMD that aligns with and overlays the contact point over which a MIM capacitor is to be created. Under the second embodiment of the invention, a stack of three layers of a first layer of TaN followed by $SiO_x$ or $Si_xN_y$ followed by a second layer of TaN is used as the dielectric layer for the capacitor whereby the first layer of TaN is used as an etch stop for an opening that is etched for the creation of the upper plate of the capacitor.

BRIEF DESCRIPTION OF THE DRAWINGS

FIGS. 1a through 1f show a Prior Art method of creating a MIM capacitor with surrounding points a electrical contact, as follows:

FIGS. 3 through 7 shows the process of the invention under the first embodiment of the invention, which has as objective the creation of a MIM capacitor and a point of electrical contact on the surface of a substrate, as follows:

FIGS. 8 through 18 address the second embodiment of the invention, as follows:

DESCRIPTION OF THE PREFERRED EMBODIMENTS

Figure 3:
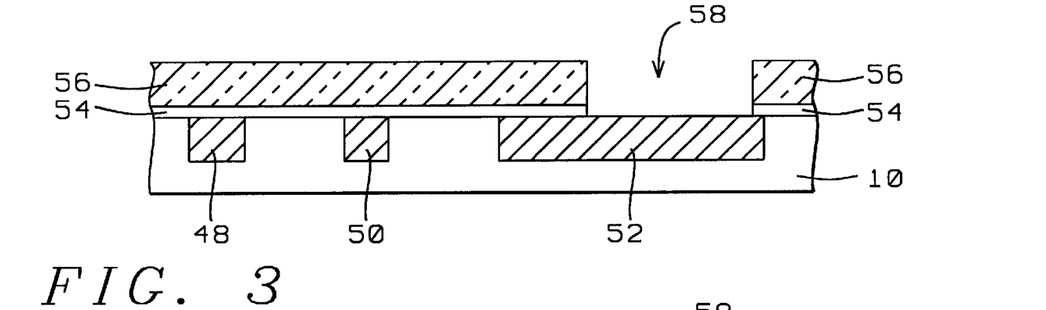
FIG. 3 shows a cross section of a semiconductor that has been provided with points of electrical contact in the surface of the substrate, a layer of insulation over which a layer of dielectric have been deposited on the surface of the substrate. The latter two layers have been patterned and etched to create an opening where a MIM capacitor needs to be created.

Referring now specifically to FIG. 3, there is shown a cross section of a semiconductor 10 that has been provided with points of electrical contact in the surface of the substrate, these points of electrical contact in the surface of substrate 10 have been highlighted as points 48, 50 and 52. The design of these points 48, 50 and 52 of electrical contact is such that points 48 and 50 are designed to provide electrical interconnects to circuit elements in the surface of the substrate whereby the circuit elements that must be provided for these circuits and on the surface of the substrate are for instance elements of resistance of inductance. Point of electrical contact 52 is the region above which a MIM capacitor is to be created.

The semiconductor substrate that can be used in order to implement the processes of the invention may have been provided with the desired conductivity be dopant implant of either polarity and of any dopant concentration whereby further the process of the invention is independent of the crystallographic orientation of the crystal structure of the silicon substrate. Typically, the semiconductor substrate 10 that is used for the implementation of the processes of the invention will have a N- or P-type polarity that has been created in the surface regions of the substrate by well formation of the indicated polarity. The substrate will typically also have a (100) crystallographic orientation.

A layer 54 of insulation has been deposited on the surface of the substrate 10. Typically methods that are used to create isolation regions on the surface of a substrate are well known in the art. Such methods include but are not limited to methods whereby layers of isolation are grown on the surface of a substrate by exposure of the surface of the substrate to an oxidizing environment, which may or may not be performed under the control of a mask thereby selectively creating layers of isolation. Other methods may apply a separate insulating layer to the surface of the substrate whereupon the layer of insulation may be patterned and etched to form regions of isolation on the surface of the substrate. The preferred method of the invention is the deposition of a layer of $Si_xN_y$, whereby the isolation layer 54 is typically and preferably formed to a thickness of between about 2000 and 3000 Angstrom. Silicon nitride is typically used as a diffusion barrier to copper and can alternatively by used as an etch stop layer. Silicon nitride layer 54 is typically deposited using PECVD procedures, at a pressure between about 300 mTorr and 400 mTorr, at a temperature between about 200 and 800 degrees C., to a thickness between about 200 and 5000 Angstrom using $NH_3$ and $SiH_4$.

A layer 56 of Inter Metal dielectric is next deposited over the surface of layer 54 of isolation. Layer 56 of Inter Metal Dielectric can contain any suitable dielectric such as for instance silicon dioxide ("oxide", doped or undoped) or silicon nitride ("nitride"), silicon oxynitride, fluoropolymer, parylene, polyimide, tetra-ethyl-ortho-silicate (TEOS) based oxides, boro-phosphate-silicate-glass (BPSG), phospho-silicate-glass (PSG), boro-silicate-glass (BSG), oxide-nitride-oxide (ONO), a low dielectric constant material, such as hydrogen silsesquioxane and HDP-FSG (high-density-plasma fluorine-doped silicate glass. The most commonly used and therefore the preferred dielectrics are silicon dioxide (doped or undoped), silicon oxynitride, parylene or polyimide, spin-on-glass, plasma oxide or LPCVD oxide. The preferred dielectric material to be used for the invention is $SiO_2$.

The deposition of the layer 56 of IMD uses conventional deposition technology and can, for instance, be deposited using PECVD procedures at a temperature of between about 350 and 450 degrees C. to a thickness between about 5000 and 10,000 Angstrom using TEOS as a source.

Opening 58 is next etched in the layer 56 of IMD and in the layer 54 of insulation. As an example of etching conditions that can be used for the etching of layer 56 is cited without however limiting the process of the invention to the etching of TEOS, which are as follows: etchant gas: $CF_4$ or $CHF_3$ at a flow rate of about 15 sccm, gas pressure about 800 mTorr, rf power density about 400 Watts, no magnetic field applied, wafer temperature about −17 degrees C., time of the etch about 10 seconds. The process of the invention for the etch of layer 56 of IMD can be performed in accordance with conventional etch practices that are well known in the art and that are largely determined by the material that is being used for the layer of IMD.

The layer 54 of silicon nitride can be etched with a silicon nitride etch recipe comprising $CHF_3$ at a flow rate between about 0 and 100 sccm, $CF_4$ at a flow rate between about 0 and 50 sccm and Ar at a flow rate between about 50 and 150 sccm.

It must be noted in FIG. 3 that the opening that is etched through layers 54 and 56 overlays and aligns with the contact regions 52 that has been provided in the surface of substrate 10 with the objective of creating a MIM capacitor overlaying this contact region 52. Contact regions 48, 50 and 52 contain, for the process of the invention, preferably copper.

Figure 4:
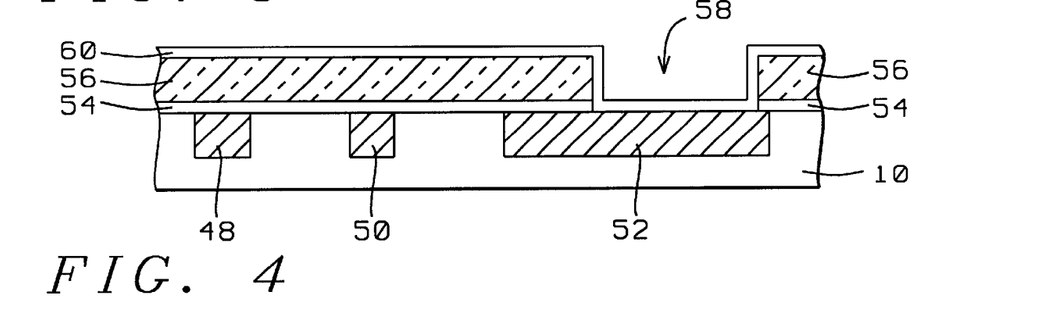
FIG. 4 shows a cross section after a layer of insulation has been deposited over the surface of the structure of FIG. 3.

FIG. 4 shows the deposition of a layer 60 of insulation over the structure that has been created in FIG. 3, this insulating layer at a later stage becomes the dielectric of the MIM capacitor that is being created. As insulator can be used for this purpose any of the materials that are accepted in the art as insulating materials thereby including but not being limited to nitride or oxide, silicon dioxide ($SiO_2$), silicon nitride ($Si_3N_4$), siliconoxynitride ($SiO_xN_y$), fluonated silicon oxide ($SiO_xF_y$), $Si_xN_y$, a titanium oxide (TaO) such as $Ta_2O_5$, a barium-strontium titanate (($Ba,Sr)TiO_3$), a lead-zirconium titanate (($Pb,Zr)TiO_3$), TiO and the like. An insulating layer, such as silicon nitride ($Si_3N_4$), can be deposited using LPCVD using a reactant gas mixture such as dichlorosilane ($SiCl_2H_2$) and amonia ($NH_3$), typically deposited to a thickness of between 50 and 2000 angstrom. Insulating layer 60 can further contain borophosphosilicate glass (BPSG), deposited by LPCVD, using tetra-ethosiloxane (TEOS) as the reactant gas. The preferred processing conditions for the deposition of layer 60 of insulating material TEOS are as follows: source: TEOS, flow rate between about 80 and 100 sccm, temperature between about 680 and 730 degrees C., pressure between about 240 and 260 mTorr, processing chamber used: an LP system, time of deposition about 60 minutes.

Figure 5:
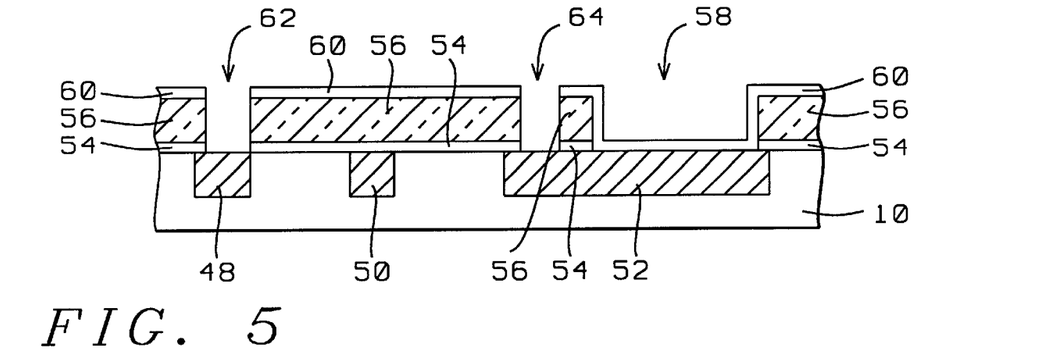
FIG. 5 shows a cross section after openings have been created in the layer of insulator and the layer of dielectric whereby these openings will be used as part of the MIM capacitor and points of electrical contact.

FIG. 5 shows a cross section of the substrate 10 after the layer 60 of insulation and the layer 56 of IMD have been etched, creating openings 62 and 64 through the two layers 56 and 60 that reach down to the surface of the copper contact points 48 and 52 in the surface of substrate 10.

Insulating layer 60 can be anisotropically etched with a plasma gas containing carbon tetrofluoride ($CF_4$) as an etchant using a commercially available parallel plate RIE etcher or an Electron Cyclotron Resonance (ECR) plasma reactor. The preferred processing conditions for the etching of insulating layer 60 are as follows: etchant used: $CF_4$/$CHF_3$, flow rate about 25 sccm, temperature about 40 degrees C., pressure about 225 mTorr, time of the etch between about 160 and 220 seconds.

Opening 62 has been etched in a location such that the opening 62 overlays copper contact point 48. The considerations that lead to the selection of this location are related to and dictated by design considerations of the purpose and further interconnect of this opening 62. In the example shown in FIG. 5, it is feasible to further use the copper layers that overlay copper contact point 48 as layers in the construction of an inductor. This inductor would be oriented vertically with respect to the surface of substrate 10, a technique that is frequently applied in the creation of inductors with the objective of improving the quality factor (Q) of the inductor in addition to minimizing the surface space that is taken up by the inductor on the surface of the substrate. As an alternate method an inductor can be created that is parallel to the surface of the substrate. This type of inductor however is limited in its application in frequency range over which the inductor can be used, in the Q factor that can be achieved (due to electromagnetic losses that are incurred by the inductor in the surface of the underlying substrate) and in the inductive value that can be created in this manner. The trend in the industry is therefore to create vertical conductors that form high frequency inductors of relatively high inductive values. The process of the invention can be applied for the creation of such an inductor.

It must further be noticed that the processing steps that have been implemented as shown in FIG. 5 are the first steps of a typical damascene process whereby the openings 62 and 64 are the openings that are required for the lower section of a typical dual damascene structure. It can therefore be stated that, after layer 60 has been deposited as shown in FIG. 4, the process of the invention can proceed by applying conventional methods of creating dual damascene structures. This is further highlighted in the following FIGS. 6 and 7.

Figure 6:
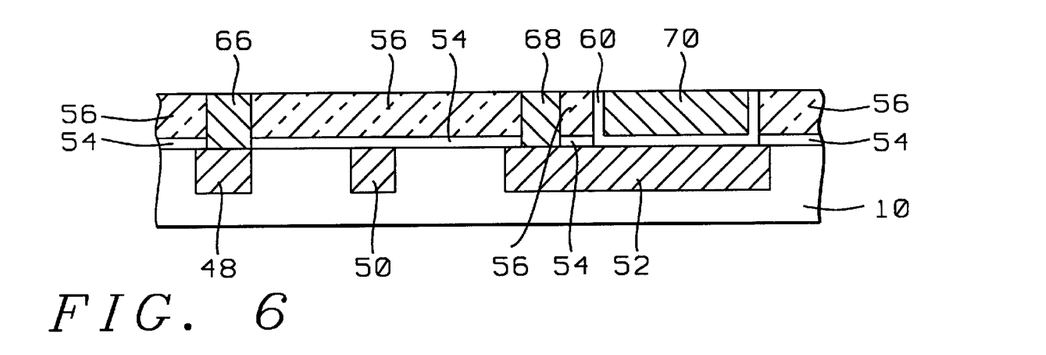
FIG. 6 shows a cross section after a layer of metal has been deposited and planarized filling the openings that have been created in the layer of insulation and the dielectric.

FIG. 6 shows how the openings 62 and 64 of FIG. 5 have been filled with metal, preferably copper, and planarized thereby creating copper plugs 66, 68 and 70.

Figure 7:
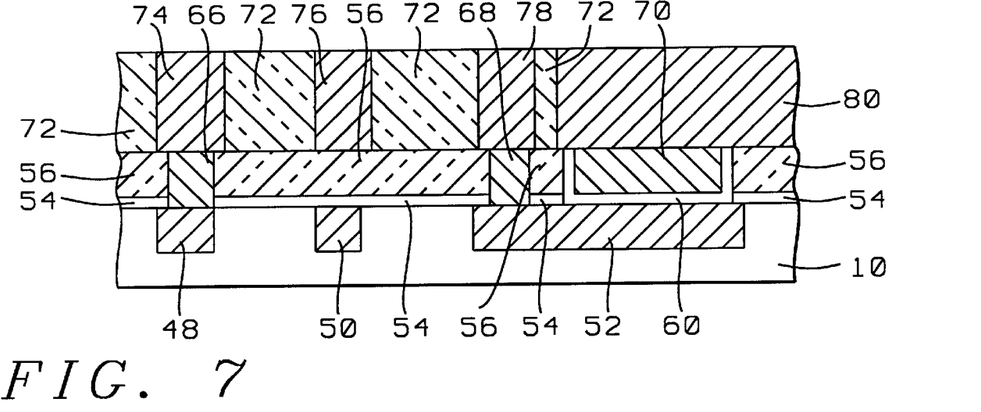
FIG. 7 shows a cross section after a second layer of dielectric has been deposited, patterned and etched in order to form extensions to the metal contacts that have been formed in the first layer of dielectric.

FIG. 7 shows a cross section after a second layer 72 of IMD has been deposited over the surface of the first layer 56 thereby including the copper plugs that have been formed in this layer 56 of IMD, openings have been created and filled with copper plugs 74, 76, 78 and 80. It is clear from the cross section that is shown in FIG. 7 that the copper plugs 66/74 from a conventional dual damascene structure as do plugs 68/78 and 70/80. It is further clear from the cross section that is shown in FIG. 7 that the plug combination 66/74 with plug 76 can be used as part of the construction of a vertical inductor while plug combinations 68/78 with plugs 70/80 are, due to the presence of the dielectric layer 60, structures that from the lower levels of a MIM structure.

FIGS. 8 through 19 address the second embodiment of the invention whereby the conventional method of creating openings and layers for a capacitor that has been highlighted in FIG. 2 is replaced with a method whereby the etch stop for the second opening that is required for the capacitor does not require the conventional layer 46 of TaN (FIG. 2).

Processing conditions that are required for the creation of the various layers and the patterning of these layers will hereafter not be highlighted for reasons of simplicity. Also, these conditions have in essence already be indicated in the exemplary explanation that has been provided above for the processes of FIG. 3 through 7 while these processes are in general well know processes in the state of the art.

Figure 8:
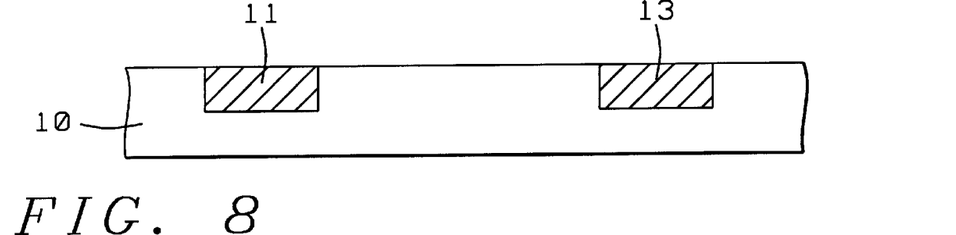
FIG. 8 shows a cross section of a semiconductor substrate that contains copper points of electrical contact in the surface of the substrate.

FIG. 8 shows a cross section of a silicon semiconductor substrate in the surface of which have been provided two copper points of contact 11 and 13. Conventional methods and processes are, as in the previous method of the first embodiment of the invention, employed for the creation of these two points of electrical contact, the two points of electrical contact 11 and 13 are in addition merely used as examples since it is clear that in an actual semiconductor surface multiple points of electrical contact are typically provided. It must be pointed out at this time that electrical point of contact 11 is the electrical point of contact above which an inductor is to be formed and that therefore forms part of the inductor that is created overlaying copper contact point 11. It must further be pointed out that electrical point of contact 13 is the point of electrical contact over which a capacitor is to be created, this point 13 of electrical contact is however not in direct contact with the capacitor, a layer of dielectric will be provided to separate point 13 from the upper and lower plates of the capacitor that is created overlying point 13.

Figure 9:
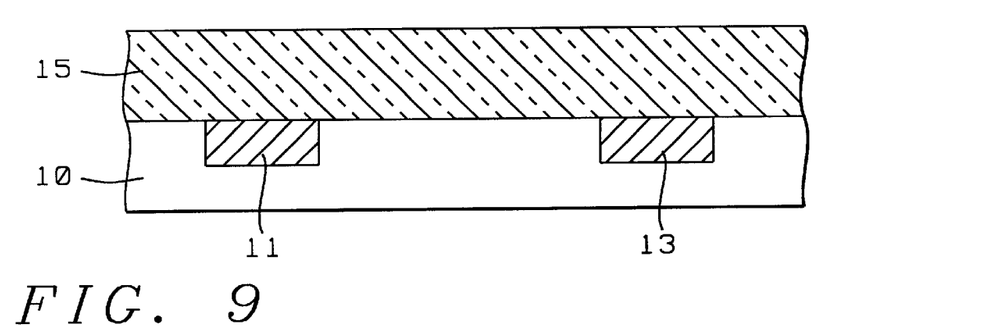
FIG. 9 shows a cross section of the substrate after a first layer of dielectric has been deposited over the surface of the substrate.
Figure 10:
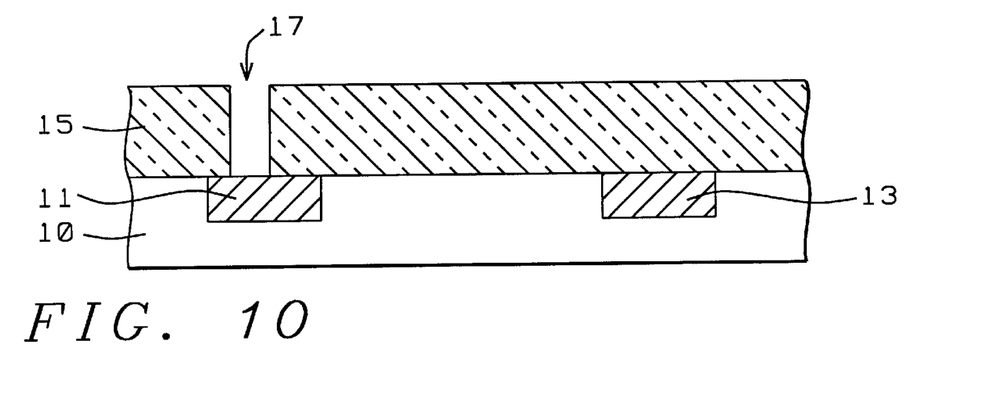
FIG. 10 shows a cross section of the substrate after the layer of dielectric has been etched creating an opening in the layer of dielectric.
Figure 11:
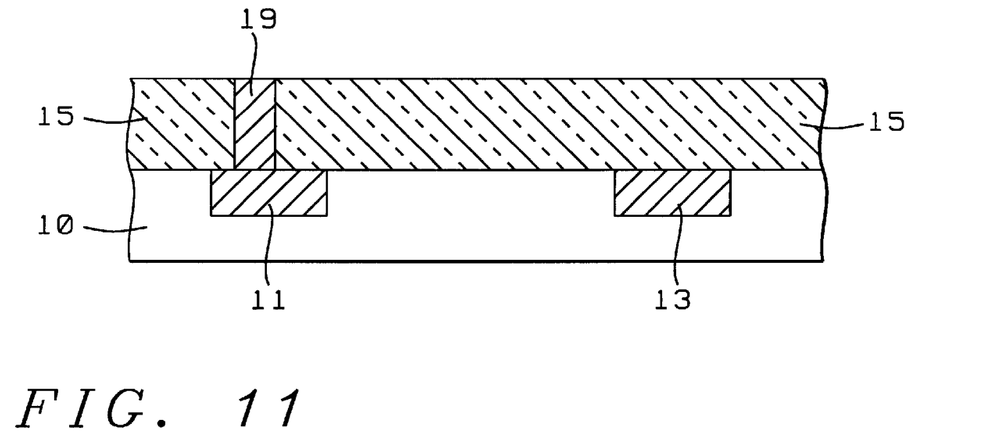
FIG. 11 shows a cross section of the substrate after the opening in the layer of dielectric has been filled with copper and the layer of deposited copper has been planarized.

FIG. 9 shows a cross section of the substrate 10 after a first layer 15 of dielectric has been deposited over the surface of the substrate, thereby including the surface of the two points of electrical contact 11 and 13. Opening 17, FIG. 10, is etched through the layer 15 of dielectric, this opening 17 penetrates the layer 15 of dielectric down to the surface of the substrate 10, partially exposing the surface of point 11 of electrical contact. The opening 17 that is created in the first layer 15 of dielectric serves as the lowest layer of an overlying inductor and must therefore be filled with a metal and planarized, forming copper plug 19 that is shown in cross section in FIG. 11.

Figure 12:
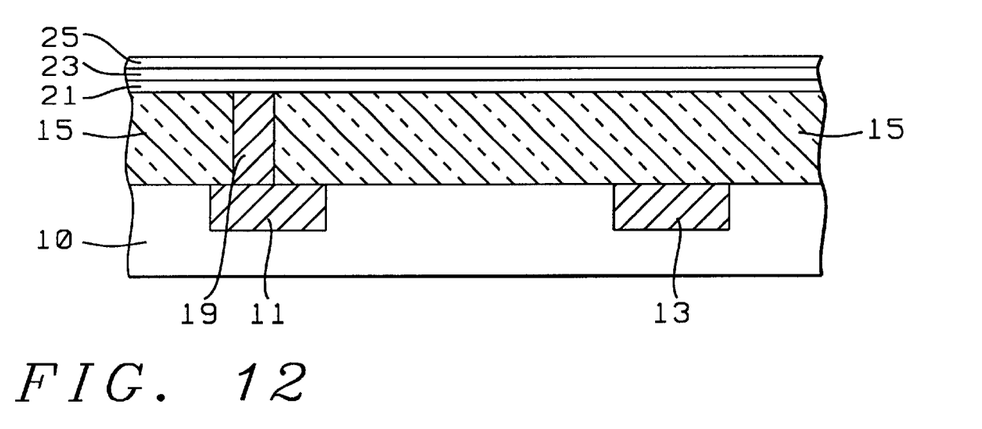
FIG. 12 shows a cross section of the substrate after a stack of three layers of a first layer of TaN followed by a layer of $SiO_x$ or $Si_xN_y$ followed by a second layer of TaN has been deposited over the surface of the first layer of dielectric.
Figure 13:
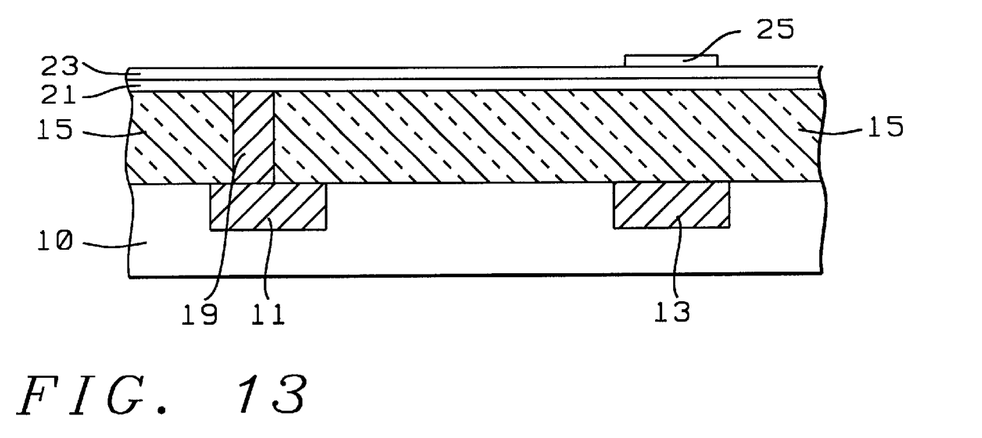
FIG. 13 shows a cross section after the second layer of TaN has been etched.
Figure 14:
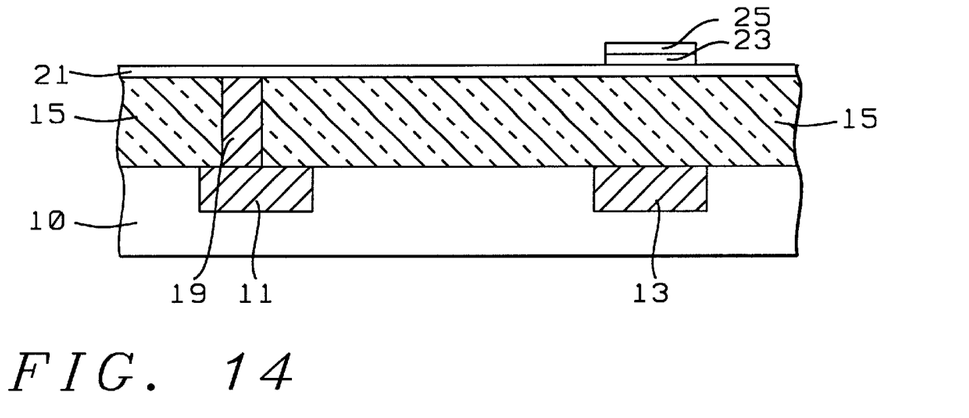
FIG. 14 shows a cross section after the layer of $SiO_x$ or $Si_xN_y$ has been etched.
Figure 15:
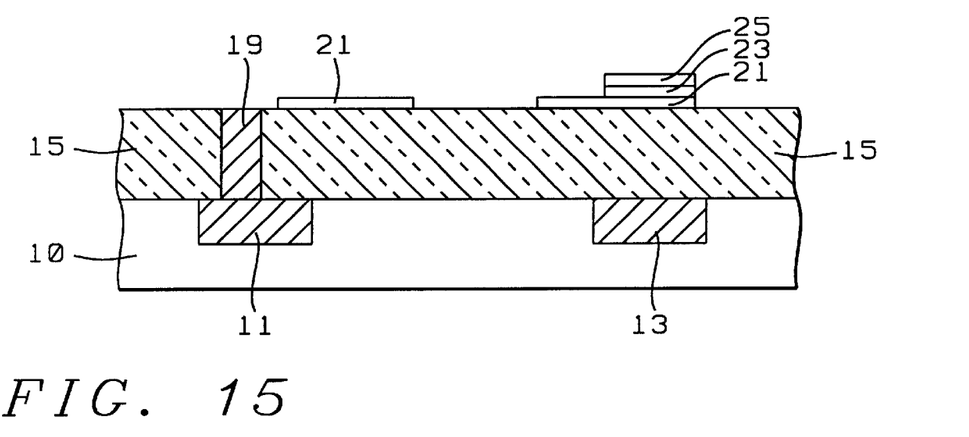
FIG. 15 shows a cross section after the first layer of TaN has been etched.

The process of the invention continues with the deposition of three layer 21, 23 and 25 that respectively contain TaN (layer 21), $SiO_x$ or $Si_xN_y$ (layer 23), and TaN (layer 25), FIG. 12. This stack of three layers must be etched in order to form the dielectric layer of the to be created capacitor, this process of etching the three layers starts with first etching layer 25, FIG. 13, after which layer 23 is etched, FIG. 14, after which layer 212 is etched, FIG. 15. Special notice must be paid to the patterns that are used to etch the three layers. Layer 25 and 23 are etched using the same pattern thereby removing essentially all of layers 25 and 23 with the exception of those portions of layer 25 and 23 that are to be part of the dielectric of the capacitor that is to be formed. FIG. 15 shows that the pattern that is used for the etch of layer 21 is extended such that a larger surface region of layer 21 remains in place whereby this extended surface region protrudes from the stack of three layers 21, 23 and 25. It will become clear from a latter cross section that this extension of layer 21 will be used to provide an interconnect to the second plate of the capacitor that is to be created.

In addition, FIG. 15 shows that layer 21 is left in place where this layer is required to separate the (two) columns of copper plugs that make up the inductor overlying plug 19. This latter layer 21 is the leftmost layer of 21 that is shown in FIG. 15.

Figure 16:
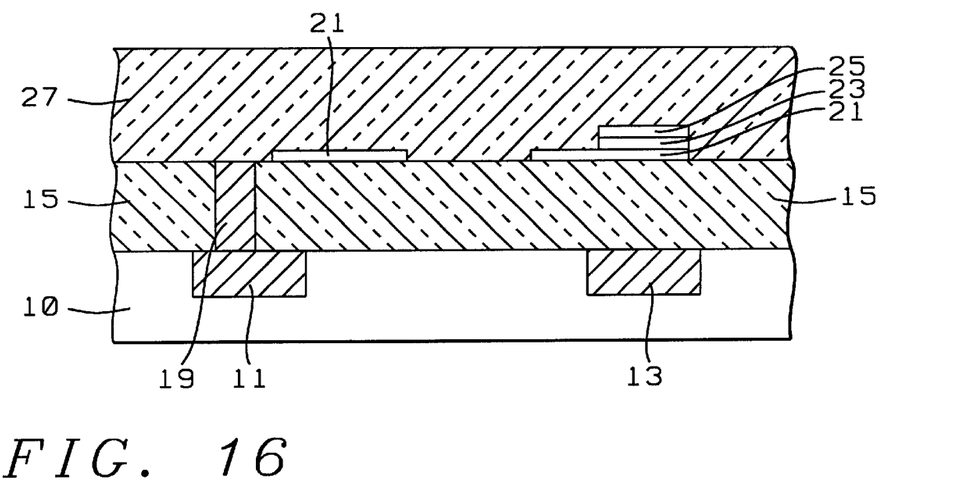
FIG. 16 shows a cross section after a second layer of dielectric has been deposited over the structure of FIG. 15.

FIG. 16 shows how a second layer 27 of dielectric is next deposited over the surface of the structure of FIG. 15, this second layer 27 of dielectric is etched (see FIG. 17) creating openings 29, 31, 33 and 35 whereby these openings are aligned such that openings 29 and 31 align with the underlying point of electrical contact 11 while openings 33 and 35 align with the underlying point of electrical contact 13. Opening 29 further aligns with copper plug 19 while opening 31 is created such that this opening can serve as part of the inductor that is to overlay contact plug 11. Opening 33 aligns with the previously provided extension to the pattern 21 such that the bottom of opening 33 is in contact with a portion of the surface of layer 21, opening 35 aligns with the surface of layer 25 such that the bottom of opening 35 is in contact with a portion of the surface of layer 25.

Figure 17:
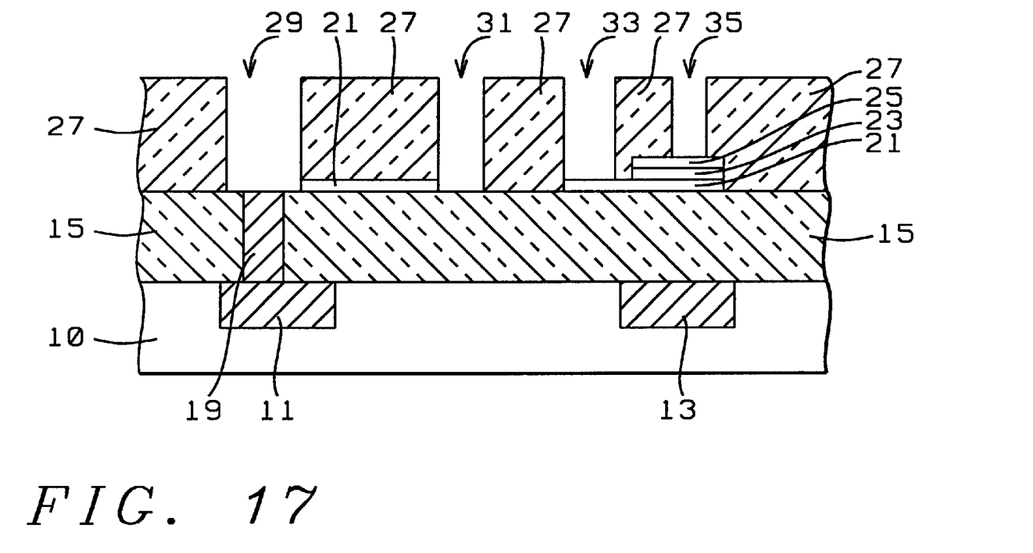
FIG. 17 shows a cross section after the second layer of dielectric has been etched thereby creating openings in the second layer of dielectric.
Figure 18:
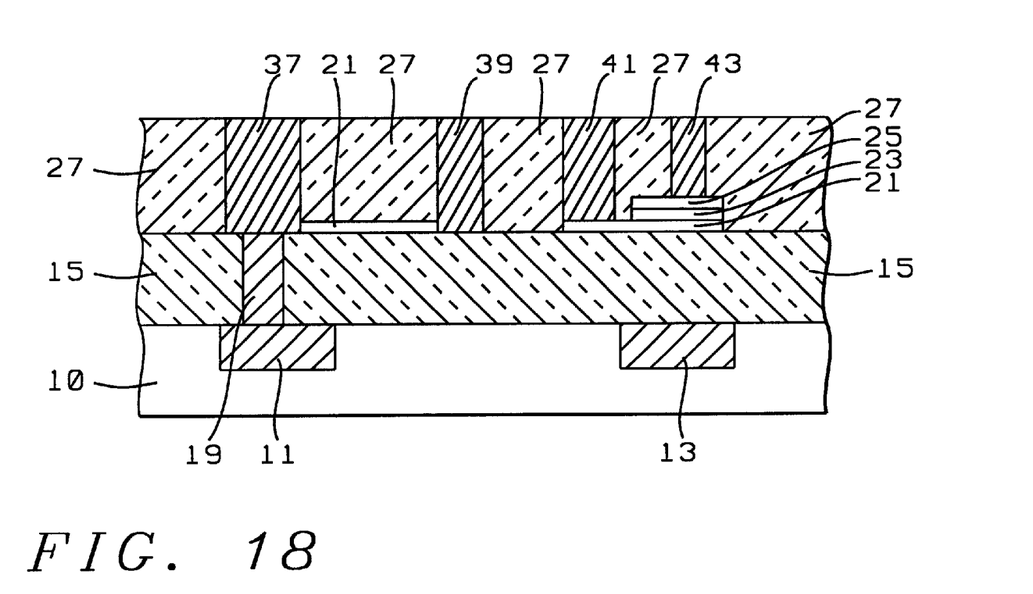
FIG. 18 is a cross section after the openings that have been created in the second layer of dielectric have been filled with copper and the deposited layer of copper has been planarized.

A layer of metal, preferably copper under the processes of the invention, is deposited over the surface of the structure that is shown in FIG. 17 and planarized, thereby creating copper plugs 37, 39, 41 and 43. It is clear from the cross section that is shown in FIG. 18 that the copper plugs 37 and 39 are an added layer of copper that is used for the construction of an inductor that is in contact with and overlays the point of electrical contact 11. It is also clear from the cross section that is shown in FIG. 18 that the copper plugs 41 and 43 form copper plugs that can further be extended upwards to form a capacitor overlying the point of electrical contact 13. The dielectric of this capacitor is formed by the stack of layers 21, 23 and 25. Most importantly is it clear from the cross section that is shown in FIG. 18 that the etch stop that has been performed in order to create openings 29, 31, 33 and 35 in the second layer 26 of dielectric uses layer 21 as an etch stop, the extension that has been provided in the pattern that has been sued for the patterning of layer 21 serves as etch stop for opening 33.

The critical differences that can be observed between the conventional method (FIG. 2) and the method of the invention can be derived by comparing the cross sections that are shown in FIGS. 2 and 18, as follows:

the conventional method does not provide a layer of TaN between adjacent copper plugs that form the upward progressing legs of the inductor thereby making electrical insulation between these copper plugs more difficult the method of the invention has eliminated the etch stop that is required to create the openings for the capacitor that use the underlying layer of dielectric as an etch stop. Under the process of the invention, a layer of TaN serves as the etch stop, and prior art applications for the formation of MIM capacitors use AlCu as the metal of the capacitor, the present invention uses Cu.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A structure for a storage capacitor node within an integrated circuit cell, said structure being further extended to contain additional electrical components on the surface of a semiconductor surface, comprising:

a semiconductor substrate, points of electrical contact having been provided in the surface of said substrate, said points of electrical contact comprising a first point of electrical contact over which a capacitive component is created, further comprising second points of electrical contact over which additional electrical components are created; a patterned first layer of insulation over the surface of said substrate;

a patterned first layer of dielectric over the surface of said patterned first layer of insulation;

a first opening through said first layer of insulation and said first layer of dielectric that aligns with said first point of electrical contact in the surface of said substrate, said opening having inside surfaces, said inside surfaces being covered with a second layer of insulation;

additional openings created in said first layer of insulation and said first layer of dielectric where additional openings are required for said capacitive component and said additional electrical components, said additional openings to penetrate through said first layer of dielectric and through said first layer of insulation, partially exposing the surface of said first and said selected second contact points provided in the surface of said substrate;

conductive material deposited in said first and additional openings created in said first layer of insulation and said first layer of dielectric, said conductive material having been planarized down to about the surface of said first layer of dielectric;

overlying layers of dielectric over the surface of said first layer of dielectric, openings created in said overlying layers of dielectric as required to complete said capacitive component and said additional electrical components, said openings filled with a conductive material that is planarized down to about the surface of the level of dielectric in which the conductive material forms a conductive plug, said overlying layers of dielectric to continue to the point where said capacitive component and said additional have been completed.

2. The structure of claim 1 wherein said first layer of insulation comprises TaN with a thickness of between about 2000 and 3000 Angstrom.

3. The structure of claim 1 wherein said first layer of dielectric has a thickness between about 3000 and 10,000 Angstrom.

4. The structure of claim 1 wherein said second layer of insulation contains a material that is selected from a group comprising $Si_xN_y$ and SiON and TaN and TiN and has a thickness of between about 50 and 2000 Angstrom.

5. The structure of claim 1 wherein said first point of electrical contact and said second point of electrical contact comprise copper.

6. The structure of claim 1 wherein said capacitive component and said additional electrical components are completed by applying damascene processes using copper as a preferred metal for conductive layers of said damascene processes.

7. The structure of claim 1 wherein said additional electrical components comprise at least one inductor.

8. The structure of claim 1 wherein said conductive material comprises copper.

9. A structure for a storage capacitor node within an integrated circuit cell, said structure being further extended to contain additional electrical components on the surface of a semiconductor surface, comprising:

a semiconductor substrate, points of electrical contact having been provided in the surface of said substrate, said points of electrical contact comprising a first copper point of electrical contact over which a capacitive component is created, further comprising second copper points of electrical contact over which additional electrical components are created;

a patterned first layer of insulation over regions of the surface of said substrate, comprising TaN with a thickness of between about 2000 and 3000 Angstrom;

a first layer of dielectric over the surface of said patterned first layer of insulation with a thickness between about 3000 and 10,000 Angstrom;

a first opening through said first layer of insulation and said first layer of dielectric that aligns with said first point of electrical contact in the surface of said substrate, said opening having inside surfaces, said inside surfaces being covered with a second layer of insulation containing a material that is selected from a group comprising $Si_xN_y$ and SiON and TaN and TiN and has a thickness of between about 50 and 2000 Angstrom;

additional openings created in said first layer of insulation and said first layer of dielectric where additional openings are required for said capacitive component and said additional electrical components, said additional openings to penetrate through said first layer of dielectric and through said first layer of insulation, partially exposing the surface of said first and said selected second contact points provided in the surface of said substrate;

copper deposited in said first and additional openings created in said first layer of insulation and said first layer of dielectric, said copper having been planarized down to about the surface of said first layer of dielectric; and overlying layers of dielectric over the surface of said first layer of dielectric, openings created in said overlying layers of dielectric using damascene processing using copper for conductive materials and as required to complete said capacitive component and said additional electrical components, said openings filled with a conductive material that is planarized down to about the surface of the level of dielectric in which the conductive material forms a conductive plug, said overlying layers of dielectric to continue to the point where said capacitive component and said additional have been completed.

10. The structure of claim 9 wherein said additional electrical components comprise at least one inductor.

11. A structure that forms a storage capacitor node within an integrated circuit cell, said structure further being extended to additional electrical components such as an inductor,on the surface of a semiconductor surface, comprising:

a semiconductor substrate, points of electrical contact having been provided in the surface of said substrate, said points of electrical contact comprising a first point of electrical contact over which a capacitive component is to be created, further comprising a second point of electrical contact over which an additional electrical component is to be created;

a first layer of dielectric deposited over the surface of said substrate;

an opening created in said first layer of dielectric that aligns with said second points of electrical contact in the surface of said substrate;

a conductive plug created in said opening in said first layer of dielectric;

a first layer of insulation formed on the surface of said first layer of dielectric, said first layer of insulation having a first surface area, said first layer of insulation overlying said first point of electrical contact in the surface of said substrate;

a second layer of insulation having a surface formed on the surface of said first layer of dielectric, said second layer of insulation being adjacent to said conductive plug created in said first layer of dielectric;

a second layer of dielectric over the surface of said first layer of insulation having a second surface area, said second surface of said second layer of dielectric area being different in value from said first surface area of said first layer of insulation by a value of third surface area of said first layer of insulation, said third surface area of said first layer of insulation being exposed as one continuous surface;

a second layer of insulation over the surface of said second layer of dielectric, having a surface area that equals said second surface area of said second layer of dielectric, said second layer of dielectric and said second layer of insulation overlying said first layer of insulation formed on the surface of said first layer of dielectric;

a third layer of dielectric deposited over the surface of said first layer of dielectric thereby including the surface of said second layer of insulation, further including said third surface of said first layer of insulation, further including the surface of said second layer of insulation overlying said first layer of dielectric;

openings created in said third layer of dielectric comprising a first opening that aligns with the surface of said second layer of insulation, further comprising a second opening that aligns with said third surface of said first layer of insulation, further comprising a third opening that aligns with said conductive plug in said first layer of dielectric, further comprising a fourth opening that is adjacent to said opening that aligns with said conductive plug in said first layer of dielectric and that is separated from said opening that aligns with said conductive plug in said first layer of dielectric by said second layer of insulation on the surface of said first layer of dielectric;

a second layer of conductive material used to fill said first, second, third and fourth openings created in said third layer of dielectric, said second layer of conductive material being planarized down to about the surface of said third layer of dielectric, creating a first, a second, a third and a fourth conductive plug in said third layer of dielectric, said first and second conductive plug forming part of said capacitive component, said third and fourth conductive plug forming part of said additional electrical components; and further completion of said capacitive component and said additional electrical components using damascene processes for this completion.

12. The structure of claim 11 wherein said first and second point of electrical contact over which a capacitive component is to be created comprise copper.

13. The structure of claim 11 wherein said conductive plug created in said first layer of dielectric comprises copper.

14. The structure of claim 11 wherein said first layer of insulation over the surface of said first layer of dielectric comprises TaN with a thickness of between about 50 and 2000 Angstrom.

15. The structure of claim 11 wherein said second layer of dielectric over the surface of said first layer of insulation comprises a material selected from the group comprises $Si_xN_y$ and SiON and TaN and TiN with a thickness of between about 100 and 4000 angstrom.

16. The structure of claim 11 wherein said second layer of insulation over the surface of said second layer of dielectric comprises TaN with a thickness of between about 50 and 2000 angstrom.

17. The structure of claim 11 wherein said additional electrical components comprise at least one inductor.

18. The method of claim 11 wherein said conductive plug created in said first opening in said first layer of dielectric and said a second layer of conductive material comprise copper.

19. A structure that forms a storage capacitor node within an integrated circuit cell, said structure further being extended to additional electrical components such as an inductor on the surface of a semiconductor surface, comprising:

a semiconductor substrate, points of electrical contact having been provided in the surface of said substrate, said points of electrical contact comprising a first copper point of electrical contact over which a capacitive component is to be created, further comprising a second copper point of electrical contact over which an additional electrical component is to be created;

a first layer of dielectric deposited over the surface of said substrate;

an opening created in said first layer of dielectric that aligns with said second points of electrical contact in the surface of said substrate;

a conductive plug created in said opening in said first layer of dielectric;

a first layer of insulation formed on the surface of said first layer of dielectric, said first layer of insulation having a first surface area, said first layer of insulation overlying said first point of electrical contact in the surface of said substrate, said first layer of insulation comprising TaN with a thickness of between about 50 and 2000 Angstrom;

a second layer of insulation having a surface area formed on the surface of said first layer of dielectric, said second layer of insulation being adjacent to said conductive plug created in said first layer of dielectric;

a second layer of dielectric over the surface of said first layer of insulation having a second surface area, said second surface of said second layer of dielectric area being different in value from said first surface area of said first layer of insulation by a value of third surface area of said first layer of insulation, said third surface area being exposed as one continuous surface, said second layer of dielectric comprising a material selected from the group comprises $Si_xN_y$ and SiON and TaN and TiN with a thickness of between about 100 and 4000 angstrom;

a second layer of insulation over the surface of said second layer of dielectric, having a surface area that equals said second surface area of said second layer of dielectric, said second layer of dielectric and said second layer of insulation overlying said first layer of insulation formed on the surface of said first layer of dielectric, said second layer of insulation comprising TaN with a thickness of between about 50 and 2000 angstrom;

a third layer of dielectric deposited over the surface of said first layer of dielectric thereby including the surface of said second layer of insulation formed on the surface of said first layer of dielectric, further including said third surface of said first layer of insulation formed on the surface of said first layer of dielectric, further including the surface of said second layer of insulation overlying said second layer of dielectric;

openings created in said third layer of dielectric comprising a first opening that aligns with the surface of said second layer of insulation overlying said second layer of dielectric, further comprising a second opening that aligns with said third surface of said first layer of insulation, further comprising a third opening that aligns with said conductive plug in said first layer of dielectric, further comprising a fourth opening that is adjacent to said opening that aligns with said conductive plug in said first layer of dielectric and that is separated from said opening that aligns with said conductive plug in said first layer of dielectric by said second layer of insulation on the surface of said first layer of dielectric; a second layer of conductive material used to fill said first, second, third and fourth openings created in said third layer of dielectric, said second layer of conductive material being planarized down to about the surface of said third layer of dielectric, creating a first, a second, a third and a fourth conductive plug in said third layer of dielectric, said first and second conductive plug forming part of said capacitive component, said third and fourth conductive plug forming part of said additional electrical components; and further completion of said capacitive component and said additional electrical components using damascene processes for this completion.

20. The structure of claim 19 wherein said additional electrical components comprise at least one inductor.

* * * * *

UNITED STATES PATENT AND TRADEMARK OFFICE
CERTIFICATE OF CORRECTION

PATENT NO. : 6,384,442 B1
DATED : May 7, 2002
INVENTOR(S) : Sheng-Hsiung Chen

It is certified that error appears in the above-identified patent and that said Letters Patent is hereby corrected as shown below:

<u>Title page,</u>
Item [75], please delete "Taiwan (TW)", and replace it with -- Taichung (TW) --.

Signed and Sealed this

Tenth Day of September, 2002

Attest:

Attesting Officer

JAMES E. ROGAN
*Director of the United States Patent and Trademark Office*